US009869727B2

(12) United States Patent
Schweigert

(10) Patent No.: US 9,869,727 B2
(45) Date of Patent: Jan. 16, 2018

(54) ARRANGEMENT AND METHOD FOR MONITORING A POWER SUPPLY

(71) Applicant: Siemens Aktiengesellschaft, Munich (DE)

(72) Inventor: Harald Schweigert, Vienna (AT)

(73) Assignee: Siemens Aktiengesellschaft, Munich (DE)

( * ) Notice: Subject to any disclaimer, the term of this patent is extended or adjusted under 35 U.S.C. 154(b) by 121 days.

(21) Appl. No.: 14/915,524

(22) PCT Filed: Sep. 2, 2014

(86) PCT No.: PCT/EP2014/068607
§ 371 (c)(1),
(2) Date: Feb. 29, 2016

(87) PCT Pub. No.: WO2015/032749
PCT Pub. Date: Mar. 12, 2015

(65) Prior Publication Data
US 2016/0209475 A1    Jul. 21, 2016

(30) Foreign Application Priority Data

Sep. 4, 2013 (EP) ..................................... 13182998

(51) Int. Cl.
*G01R 31/40* (2014.01)
*G06F 1/26* (2006.01)
(Continued)

(52) U.S. Cl.
CPC ............... *G01R 31/40* (2013.01); *G06F 1/26* (2013.01); *H02H 1/0076* (2013.01); *H03K 5/125* (2013.01)

(58) Field of Classification Search
CPC ... G01R 31/40; G06F 1/26; G06F 1/28; G06F 1/263; H02H 1/0076; H03K 5/125
See application file for complete search history.

(56) References Cited

U.S. PATENT DOCUMENTS 6,574,577 B2 * 6/2003 Stapleton ................ G06F 1/263
                                              702/117
8,680,884 B2 * 3/2014 Chobot .................. G01R 31/40
                                              323/271

(Continued)

FOREIGN PATENT DOCUMENTS

GB       2 074 406     10/1981
WO   WO 2013/079110    6/2013

*Primary Examiner* — Minh N Tang
(74) *Attorney, Agent, or Firm* — Cozen O'Connor

(57) ABSTRACT

A method for monitoring a power supply connected to a superordinate controller via a signal line, wherein the superordinate controller queries whether the power supply is operating faultlessly at variable intervals, where during faultless operation, a power-good signal is continuously transmitted by the power supply to the superordinate controller via the signal line and, if a fault occurs, an indicating signal is transmitted by the power supply to the superordinate controller via the signal line as a switching sequence of high and low signals such that each signal change of the switching sequence occurs only after a time period that is longer than an expected greatest query interval and each signal of the switching sequence that does not correspond to the power-good signal is shorter than a specified signal duration for indicating a total failure of the power supply, whereby the superordinate controller receives more information than previously.

27 Claims, 4 Drawing Sheets

(51) Int. Cl.
*H03K 5/125* (2006.01)
*H02H 1/00* (2006.01)

(56) References Cited

U.S. PATENT DOCUMENTS

| | | |
|---|---|---|
| 2003/0140259 A1 | 7/2003 | Chan et al. |
| 2009/0066523 A1 | 3/2009 | Honda et al. |
| 2010/0235652 A1 | 9/2010 | Wilson et al. |
| 2012/0177160 A1 | 7/2012 | Abe |

* cited by examiner

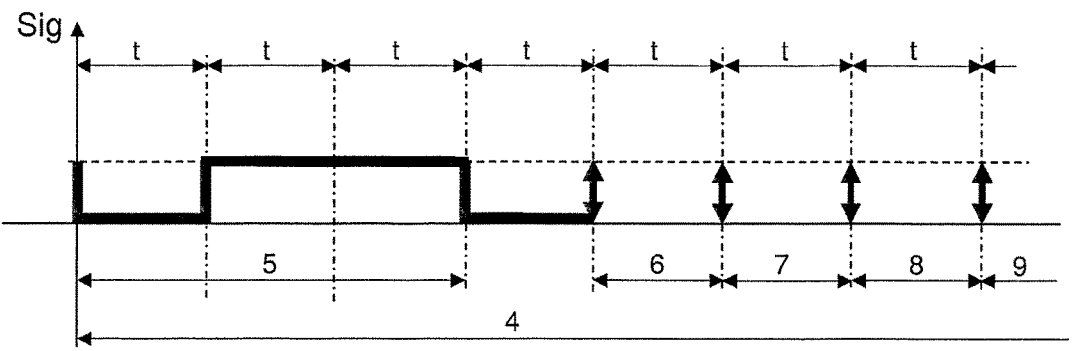
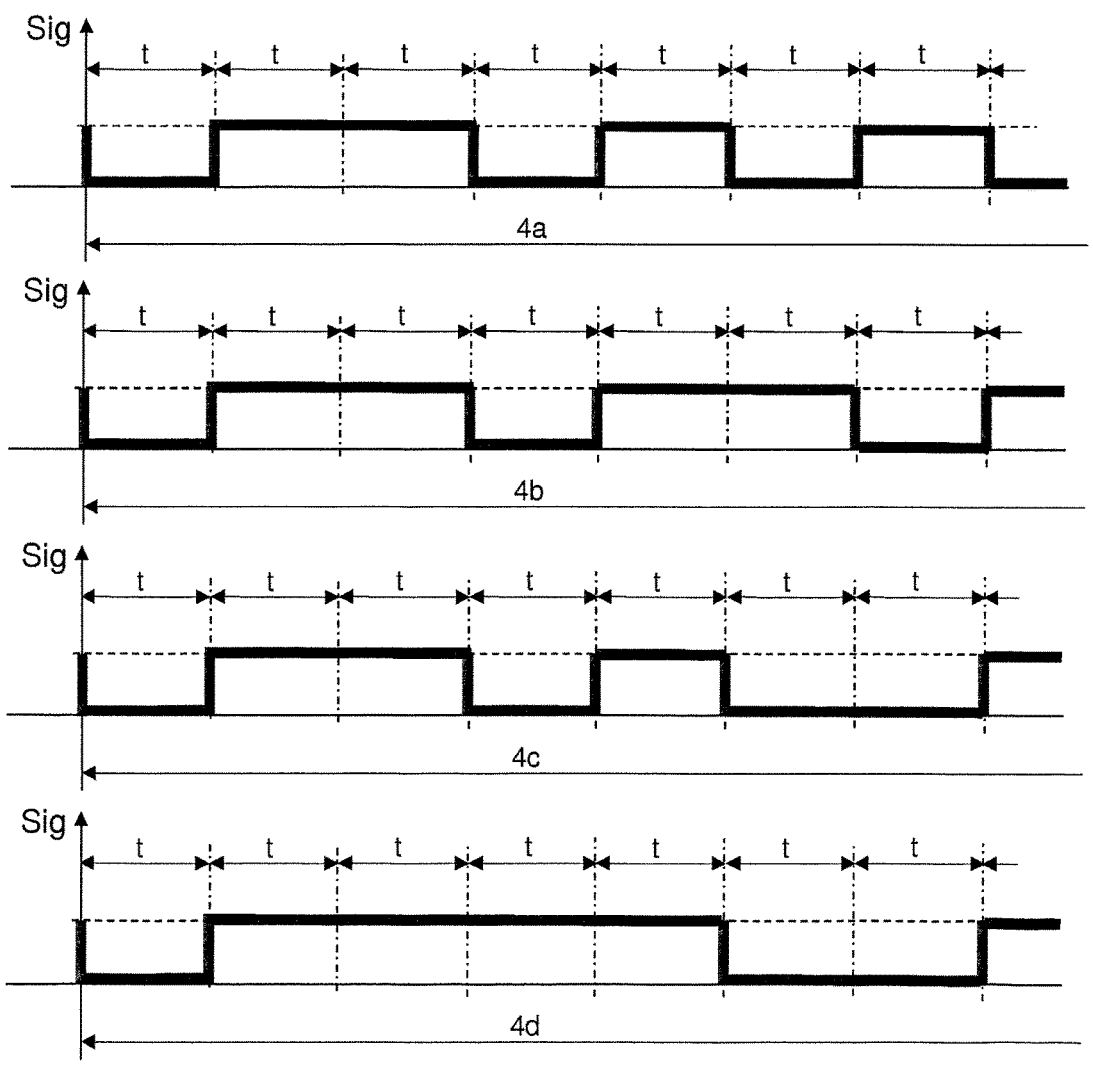

ARRANGEMENT AND METHOD FOR MONITORING A POWER SUPPLY

CROSS-REFERENCE TO RELATED APPLICATIONS

This is a U.S. national stage of application No. PCT/EP2014/068607 filed 2 Sep. 2014. Priority is claimed on European Application No. 13182998 filed 4 Feb. 2013, the content of which is incorporated herein by reference in its entirety.

BACKGROUND OF THE INVENTION

1. Field of the Invention

The invention relates to an arrangement and method for monitoring a power supply which is connected to a superordinate controller by means of via a signal line, where the superordinate controller is used to query whether the power supply is operating faultlessly at variable query intervals.

2. Description of the Related Art

In various arrangements that include power supplies, the need arises to check the status of the power supply and to detect the occurrence of a fault via a superordinate controller. This is especially the case with industrial plants, where a number of power supplies are connected via signal lines to a central plant controller. The monitoring by a superordinate controller allows a faulty power supply or a faulty load connected to the power supply to be detected and timely action can be taken to avoid the threat of an outage of part of the plant.

A signaling relay for monitoring power supplies (e.g. VME421 made by Dipl.-Ing. W. Bender & Co KG) is known from the prior art, where the signaling relay has its own comparator with a reference. Power supplies monitored in this way are used, for example, for supplying power to industrial plants. Furthermore, power supplies with an integrated signaling relay are known. In such cases, the power supplies have their own comparator with a reference for activating the signaling relay. The signaling relay signals to the superordinate plant controller that the output voltage has fallen below a predefined value. An operator of the plant controller can deduce from this that the parts of the plant supplied via the faulty power supply (relays, contactors, light barriers, or proximity sensors) are no longer functioning as envisaged or are no longer supplying reliable data. A possible reaction can be an orderly shutdown of the plant. Another possible reaction is a switchover to available redundant parts of the plant.

In such cases, the signaling relay is applied to the digital input of the superordinate controller and is provided with a supply voltage. As a rule, the superordinate controller comprises a stored-program controller (SPC) and executes a plant control program cyclically. In each program execution, each digital input of the SPC is usually queried once, where the cycle times can be variable, depending on the control and evaluation tasks to be performed at the time.

In specific terms, the power supply is monitored by the SPC querying the signal state at the digital input to which the signaling relay is connected. For example, a normal output voltage is indicated by a high signal, while a low signal indicates that the output voltage has fallen below a specified threshold value. Such a checking method, although it allows the use of a simple digital input of an SPC, does not deliver any differentiated status information of the power supply.

WO 2013/079110 A1 discloses a conventional selectivity module or diagnosis module, which is configured for transferring a status signal to a superordinate controller. Here, the selectivity module includes a number of channels for parallel supply of different loads. The status signal contains the information about the individual channel states in serially-encoded form. During operation, a switching sequence of high/low signals is continuously transmitted to a digital input of the superordinate controller.

SUMMARY OF THE INVENTION

It is an object of the invention to provide an improved arrangement and method for monitoring a power supply.

This and other objects and advantages are achieved in accordance with the invention by providing an arrangement and method in which a "power-good" signal is continuously transmitted during faultless operation by a power supply via a signal line to the superordinate controller and, if a fault occurs, an indicating signal is transmitted by the power supply to the superordinate controller via the signal line as a switching sequence of high and low signals such that each change of the switching sequence occurs only after a period of time that is longer than an expected greatest query interval and such that each signal of the switching sequence that does not correspond to the power-good signal is shorter than a specified signal duration for indicating a total failure of the power supply. On the one hand, this provides the option of assigning a specific fault a characteristic switching sequence of high/low signals and, on the other hand, a total failure of the power supply is reliably detected, as soon as a switching sequence changes into a permanent low signal. The superordinate controller thus receives more information than was previously the case. In the normal state, the power-good signal is transmitted, which is inevitably only transmitted for fault-free power supply, fault-free load and fault-free signal line. As soon as a fault occurs, the power-good signal will be interrupted by a switching sequence of high-low signals. Compared to a normal serial transmission, the difference is that the signal changes of the switching sequence occur at time intervals that are longer than the time segments between the queries of the superordinate controller. Only in this way is it possible to use an input stage designed for querying static signals as a digital input for transmission of additional information. In addition, a robust relay able to be employed reliably in the field of automation technology is able to be used to create the indicating signal, because by the continuous transmission of a power-good signal in normal operation no ongoing switching changes occur, which would have a negative effect on the service life of the relay.

In an advantageous embodiment, a high signal is transmitted by the power supply via the signal line to the superordinate controller as the power-good signal. In such an embodiment, no additional switching for active transmission of a low signal is necessary. A high signal at a signal output of the power supply is transmitted directly via a suitable switching element (e.g., relay) to the superordinate controller. As soon as the power supply fails or the signal line is interrupted, the high signal inevitably switches over to a low signal. Each signal of the switching sequence that does not correspond to the power-good signal is then a low signal, for which a signal duration for indicating a total failure of the power supply is specified.

It is of advantage for a longest cycle time to be expected of the superordinate controller comprising a stored program controller to be specified as the greatest query interval to be expected. The use of an SPC as a superordinate controller thus allows a simple definition of the minimum period of time between the signal changes of the switching sequence provided.

In the simplest case, it is advantageous for a greatest query interval to be expected of 150 ms to be specified. It is thus insured, with the exception of negligible special cases, that the superordinate controller securely detects a signal change of the switching sequence.

In one embodiment of the invention, it is an advantage for each signal change of the switching sequence only to occur after a period of time, which is at least twice as long as the greatest query interval to be expected. The sampling theorem according to Fourier is thus fulfilled, which is based on any given signal with any given frequency. Such a signal is then uniquely recognized when the sampling frequency of the receiver is at least twice as high as the highest frequency portions of the received signal.

In another embodiment of the invention, each query time is stored in the superordinate controller together with the signal state of the indicating signal and the transmitted switching sequence is derived from a sequence of these stored values and a specified fixed clock of the indicating signal. Here, the fixed clock of the indicating signal specifies the smallest possible period of time between two signal changes of the switching sequence, without a signal change absolutely having to occur with each clock. Here, superordinate controller is always aware of when a signal change could occur, i.e., with each clock of the indicating signal. By overlaying this clock pattern with the timing pattern of the stored signal states, the actual switching sequence can be derived in a simple manner. However, it is of no significance in this case whether, during the period of signal state that remains the same, the query is at the beginning or towards the end of this signal state period. The clock period of the indicating signal thus only has to be slightly longer than the greatest query interval of the superordinate controller to be expected.

In a further embodiment of the method, different types of fault are specified for the power supply, of each type of fault having its own switching sequence and, when a fault occurs, of the corresponding switching sequence is transmitted to the superordinate controller as a fault-specific indicating signal. This allows a differentiated analysis in the event of a failure, where a suitable reaction to different faults occurs. Fault types that do not directly affect the basic functionality of the power supply do not lead immediately to the power supply being switched off, but result in maintenance measures during a future planned check of the plant.

In this case, it is advantageous for a priority level to be specified for the power supply for each type of fault and, with faults that occur simultaneously, for the transmission of the corresponding switching sequences to be arranged in order of the assigned priority level. In this way, the indication of fault types that require the power supply to be switched off is not blocked by the simultaneous occurrence of non-critical faults.

In this connection it is also useful, when the power supply is switched on, for the power supply to transmit a respective identification for each type of fault to the superordinate controller and for the priority level and a repetition specification for a multiple transmission of the corresponding switching sequence to be taken from the respective identification. Thus, after commissioning or a change to the settings of the power supply, the superordinate controller is configured for orderly receipt of different switching sequences.

In another embodiment, in accordance with a repetition specification, a first switching sequence is transmitted a number of times consecutively to the superordinate controller and this repeated transmission is aborted and a second switching sequence is transmitted if a new fault, to which the second switching sequence is assigned, arises. Basically, the repetition of a switching sequence serves to improve the recognition of this switching sequence. As soon as a new fault arises, especially with a higher priority, the repetition is aborted to transmit the new and possibly more important message to the superordinate controller in good time.

To avoid false alarm messages, it is advantageous for a tolerance period to be specified for the power supply, when the tolerance period starts to elapse on occurrence of a fault and when for a continuing fault after the tolerance period has elapsed, the corresponding switching sequence is transmitted to the superordinate controller. In this way, it is insured that exceeding or falling below a threshold value for a very brief period is not indicated immediately as a fault.

It is also of advantage for a time limit to be specified for the duration of a faulty output voltage, after the expiry of which a switching sequence recently transmitted is aborted and instead a continuous signal is transmitted, which does not correspond to the power-good signal. This measure is especially sensible for a power supply without a separate auxiliary supply of the indication electronics, because with a total failure of the power supply, the signal is transmitted which does not correspond to the power-good signal. The superordinate control recognizes this state as an indication of an unchanging output voltage fault and thus as a total failure of the power supply. A secure distinction is made thereby between a signal transmission with a number of signals in a direct sequence and a total failure of the power supply.

In yet a further embodiment of the method, the power supply is switched off for specific faults and the power supply, after a new activation, transmits a corresponding switching sequence to the superordinate controller. This insures that, if it is necessary to switch the power supply off immediately, the cause of the fault is indicated to the superordinate controller. This can be the case with a sudden overheating of the power supply, where a temperature warning message can no longer be transmitted before the power supply is switched off. Fault tracing is made easier by the retrospective fault message.

For improved fault tracing, it is also sensible for each received switching sequence, which is recognized as a fault message to be stored with a time stamp in the superordinate controller.

In a simple embodiment of the method, at least one output voltage of the power supply is continuously monitored and, if the output voltage dips to a specified extent over a specified minimum period of time, the previously continuously transmitted power-good signal is ended and the corresponding switching sequence for indicating the output voltage dip is transmitted to the superordinate controller. In this case, it is advantageous for a period of time to be specified as the minimum time that is longer than the longest correction time of the power supply to be expected after a jump in load. Jumps in load occur when consumers are connected or disconnected and are especially frequent in industrial plants. A resulting output voltage change is usually corrected by the power supply without there being any fault present requiring notification.

In addition or as an alternative thereto, a specific temperature of the power supply is continuously monitored and, if a threshold temperature is reached, the corresponding switching sequence is transmitted to the superordinate controller to indicate that the temperature has been exceeded. Furthermore, in addition or as an alternative thereto, an output current of the power supply is continuously monitored and, if a threshold output current is reached, the corresponding switching sequence is transmitted to the superordinate controller to indicate that the output current has been exceeded.

For an improved detection of indicating signals by the superordinate controller, it is sensible for a check to be made in the power supply, before a sequential transmission of switching sequences to the superordinate controller, as to whether two defined switching sequences in the transition area by chance produce another defined switching sequence and for in this case an extended low signal or an extended high signal to be transmitted between the sequential switching sequences. It is thus insured that a switching sequence that occurs by chance is not incorrectly interpreted as a fault message.

An alternate measure provides for a sequential transmission of switching sequences to the superordinate controller to be checked in the power supply to determine whether, in the transition area of two defined switching sequences, another defined switching sequence is produced by chance and in this case, to indicate an incorrect fault message, for a separately predefined switching sequence to be transmitted to the superordinate controller.

It is also an object to provide an arrangement for implementing one of the methods in accordance with the disclosed embodiments, where the input of the superordinate controller, at which the signal line is present is only designed for the evaluation of high/low signals. In this way, a superordinate controller with an especially simply constructed interface for implementing the method is able to be used.

In an advantageous embodiment of the arrangement, the power supply is a clocking direct current power supply, with one output for connecting the signal line. Such power supplies are especially suited for supplying consumers in industrial plants, where a notification of faults to the superordinate controller is sensible for maintaining the availability of the plant. In this case, it is useful for separate notification electronics to be configured in the power supply, which are connected to an auxiliary supply independent of the output voltage of the power supply. This insures that even after the output voltage has been switched off, a message in the form of switching sequences is sent to the superordinate controller.

In another embodiment separate indication electronics are configured in the power supply, which are connected via a buffer circuit with an energy store to the output voltage of the power supply, so that even after the output voltage is switched off, the indication electronics is supplied with power by the energy store. A battery or a capacitor are available as an energy store, for example, through which, even after a failure of the output voltage, an indicating signal is able to be transmitted to the superordinate controller.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The invention will be explained below by way of examples that refer to the enclosed figures, in which:

FIG. 3 shows a graphical plot of the structure of a switching sequences in accordance with the invention;

FIG. 4 shows graphical plots of exemplary switching sequences in accordance with the invention;

DETAILED DESCRIPTION OF THE EXEMPLARY EMBODIMENTS

Figure 1:
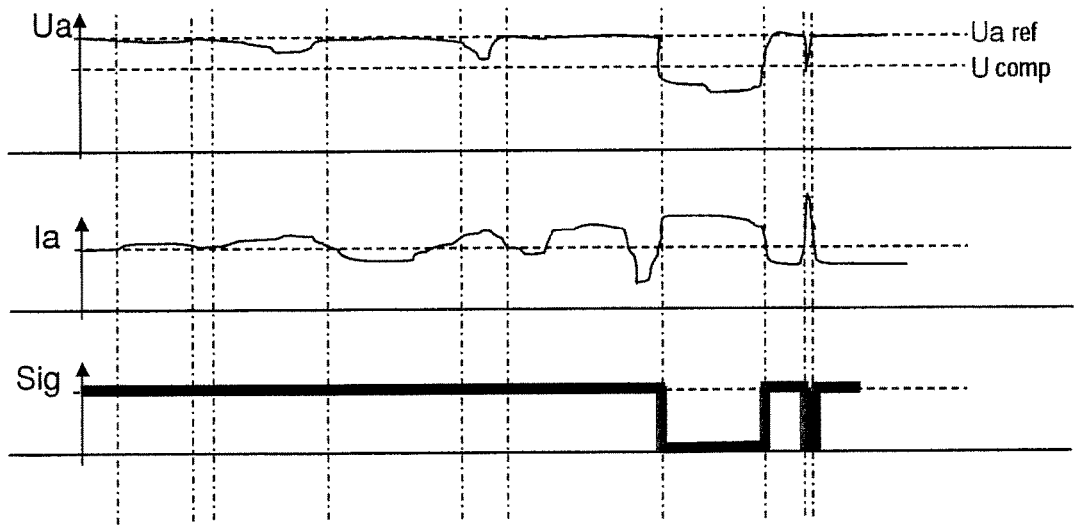
FIG. 1 shows a graphical plot indicating the signal of a power supply in accordance with the prior art.

Conventional power supplies signal dips in output voltage via an indicating signal Sig, which is derived directly from the measured output voltage Ua (see FIG. 1). For as long as the output voltage Ua corresponds to a reference voltage Ua ref, a high signal is transmitted to a superordinate controller. If, however, the output voltage Ua falls below a threshold value U comp, then the indicating signal Sig is switched over to a low signal. A current limiter causes the output voltage Ua to fall if the output current Ia exceeds a current limit.

If such an indicating signal switches into the low state for only a few milliseconds, the detection is dependent on the query behavior of the superordinate controller. If the superordinate controller involves a stored program controller with a variable cycle time, the input at which the indicating signal is present is queried, generally only once per execution of the cycle. It is then left to chance whether there is a query during a brief low state. In addition differentiated fault transmission to the superordinate controller is not possible with such an indicating signal.

In order to overcome these disadvantages, in accordance with the invention an indicating signal is transmitted to the superordinate controller as a switching sequence of high/low signals. In this case, each signal change of the switching sequence only occurs after a period of time that is longer than the expected greatest query interval. In addition, the duration of each signal of the switching sequence that does not correspond to the power-good signal is shorter than a specified signal duration for indicating a total failure of the power supply.

Figure 2:
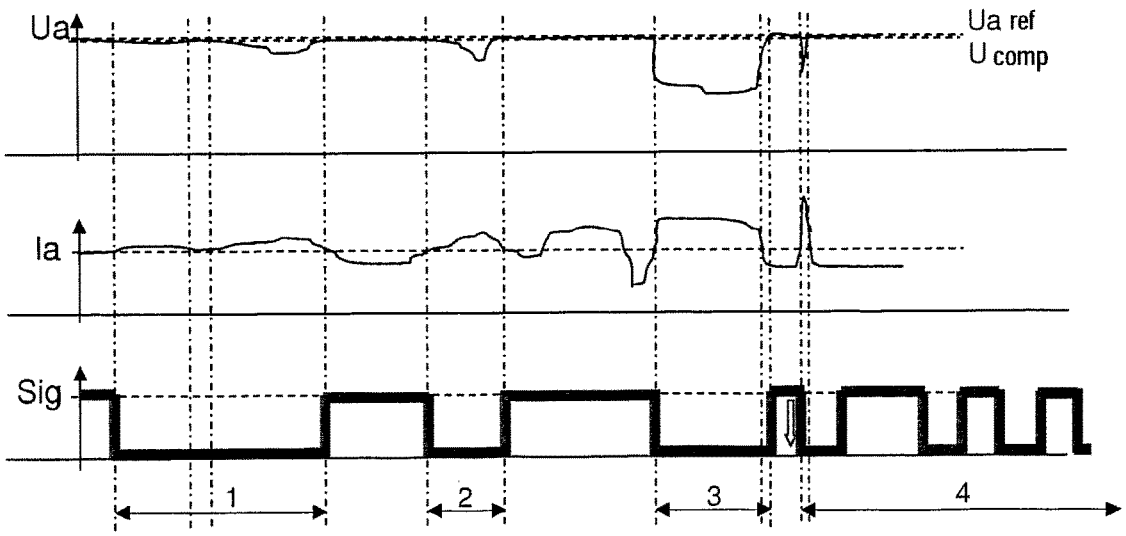
FIG. 2 shows a graphical plot of a switching sequence for notifying output voltage dips in accordance with the invention.

This creates the opportunity to indicate all voltage dips 1, 2, 3 that last longer than a query interval of the superordinate controller. Here, the threshold value U comp lies only slightly below the reference output voltage Ua ref. A shorter voltage dip is indicated by a predefined switching sequence 4 of high/low signals (FIG. 2). There is thus a decoupling of the temporal course of a fault that occurs (e.g., dip in the output voltage) from the indicating signal Sig for transmitting this fault to the superordinate controller.

A high signal is preferably specified as the power-good signal. In this case, the power supply actively transmits this signal to the superordinate controller until a fault occurs, which causes the transmission of a switching sequence 4, or until the power supply fails or until the signal line is interrupted.

As an alternative to this, there is the option to connect a pull-up resistor upstream of the signal input of the superordinate controller. A relay to create the switching sequence 4 is then switched so that, when the coil is excited, the indicating signal is pulled to ground. A low signal is then present as a power-good signal at the input of the superordinate controller. Here, the signal is transmitted via an electrical or an optical indicating signal Sig, where the data transmission is based on the power-good signal. This means that in the normal case an active signal is permanently present at the superordinate controller. A switchover to a switching sequence is only made to transmit a fault.

For example, a relay or an optically separate signal switching transistor serves to transmit a switching pattern. An SPC is provided as a superordinate controller, for example. A significant difference compared to a conventional serial transmission consists of the switchover between high and low signal occurring in time intervals that are longer than the maximum program execution time (cycle time) of the SPC to be expected. Only through this is it possible to use an input stage designed for querying static signals, such as a digital input, for transferring additional information to the CPU of the SPC.

In the simplest case, to indicate a brief dip of the output voltage Ua, there is a lengthening of a low signal to a duration that is greater than the cycle time of the SPC. With a brief dip in the output voltage of a few milliseconds (e.g. 10 ms), the relay then drops out for e.g. 200 ms. Another option consists of transmitting a switching sequence 4 of high-low signals to the SPC (FIG. 2).

FIG. 3 shows a graphical plot of the structure of a differentiated indicating signal Sig. With such an indicating signal Sig, the opportunity is created to indicate different types of faults. In this case, criteria are defined that indicate a fault situation. In relation to the output voltage Ua, for example, a period of time is specified that is greater than the correction time of the power supply after a jump in load. To this end, a reference voltage value Ua ref is defined. A criterion for indicating a fault is then fulfilled if the output voltage Ua falls away over the period of time to below the reference voltage value Ua ref.

A further typical criterion consists of the output voltage Ua falling during a further period of time that exceeds the correction time of the power supply by more than, e.g., 30% below the reference voltage value Ua ref. Thus, a massive short-term overload is detected, which is caused by a time-limited short circuit. The indication of such a fault via a corresponding switching sequence of high-low signals leads to an immediate intervention in the function of the plant.

Other sensible criteria are threshold specifications for the temperatures of critical components or combinations of temperature criteria and criteria that relate to the output voltage Ua or the output current Ia of the power supply.

The relay only knows the two switching states "drop out" or "pull-up". Therefore, simple indication electronics for activation of the relay are provided in the power supply. Depending on the information transmitted, the relay is activated in accordance with a predefined switching sequence 4. Such a predefined switching sequence 4 begins, for example, with a start bit 5, which consists of a low signal of a clock length t and a subsequent high signal of two clock lengths t. A period of time that is longer than the greatest query interval (e.g. 250 ms) to be expected is specified as a clock length t. The start bit 5 is followed by another low signal of a clock length t and then a number of bits 6, 7, 8, 9 are available for information transmission. A high signal corresponds to the binary number "1" and a low signal corresponds to the binary number "0". Sixteen different switching sequences 4 are able to be defined, for example, with four consecutive bits 6, 7, 8, 9.

A hierarchy of fault types is advantageous, where the transmission of an indicating message is interrupted if a fault with a higher priority occurs. In the simplest case, this more important message is the complete absence of the output voltage Ua of the power supply. Even if there is no longer a supply to the relay and the relay fails permanently, this will be recognized by the SPC as a total failure of the power supply. A permanently dropped-out relay thus transfers higher-quality information than a relay that is still switching in a defined switching sequence 4.

For safeguarding message transmission, it is advantageous to transmit a switching sequence 4 several times in succession, but not continuously, in order not to reduce the service life of the relay. For a unique evaluation, the repetition specification for each switching sequence 4 is transmitted to the SPC beforehand in the form of an identifier. This occurs, for example, after each commissioning or resetting of the power supply. This identifier is likewise transmitted in the form of a switching sequence of high-low signals, where, for example, the sequence is prefixed with a start bit defined separately for this process.

FIG. 4 shows graphical plots of exemplary switching sequences 4a, 4b, 4c, 4d. The first three switching sequences 4a, 4b, 4c have the same start bit and are assigned to three different types of fault, for example. The fourth switching sequence 4d with a different start bit is used, for example, to indicate an incorrect message.

The invention also covers power supplies with a number of power outputs, where a fault that occurs is transmitted to the superordinate controller with an assignment to the output involved. This is achieved, for example, by a corresponding identification of the output at the beginning or at the end of a switching sequence 4a, 4b, 4c.

Figure 5:
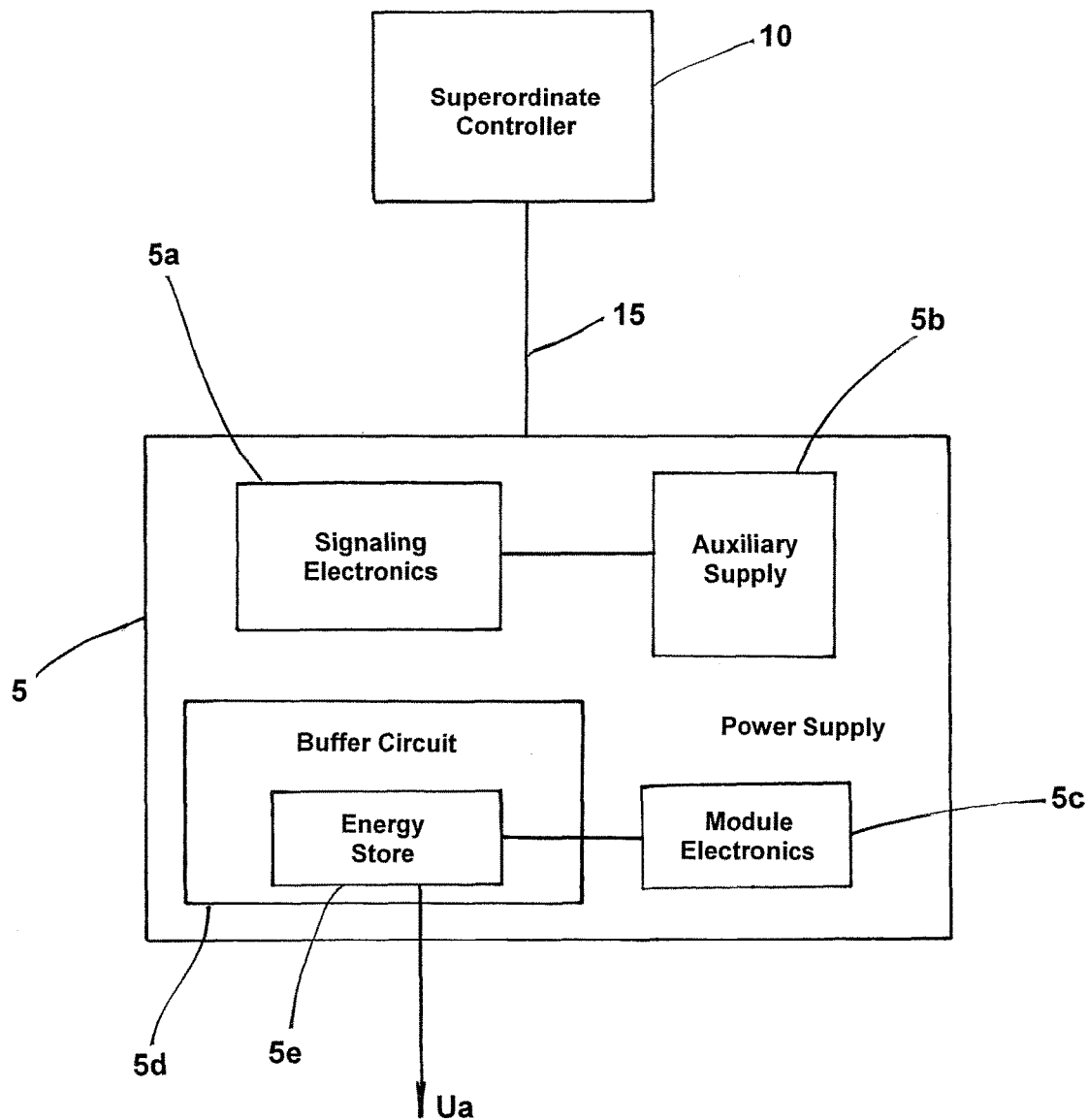
FIG. 5 is a schematic block diagram of an arrangement in accordance with the invention.

FIG. 5 is a schematic block diagram of an arrangement in accordance with the invention. The arrangement comprises a power supply 5 and a superordinate controller 10 connected to the power supply connected via a signal line 15. In accordance with the invention, the superordinate controller 10 performs queries at variable query intervals to determine whether the power supply 5 is operating faultlessly.

The arrangement is particularly configured to continuously transmit, by the power supply 5, a power-good signal to the superordinate controller via the signal line 15 during faultless operation, and to transmit an indicating signal Sig by the power supply 5 to the superordinate controller 10 via the signal line 15 as a switching sequence 4 of high-low signals if a fault occurs, such that each signal change of the switching sequence 4 occurs only after a time period which is longer than an expected greatest query interval, and such that each signal of the switching sequence 4 which does not correspond to the power-good signal is shorter than a specified signal duration to indicate a total failure of the power supply. In addition, the input of the superordinate controller 10 at which the signal line 15 is present is only configured to evaluate high/low signals.

The power supply 5 includes separate signaling electronics 5a that are connected to an auxiliary supply 5b independent of the output voltage Ua of the power supply 5. The power supply 5 also includes separate module electronics Sc which are connected to the output voltage Ua of the power supply via a buffer circuit 5d with an energy store 5e. As a result, after the output voltage Ua has been switched off the power supply for the signaling electronics 5a is provided via the energy store Se.

Figure 6:
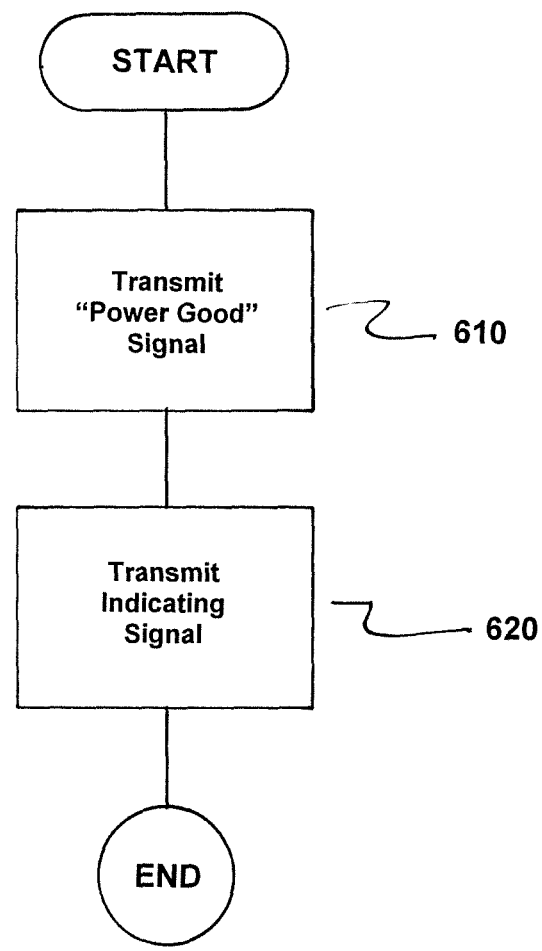
FIG. 6 is a flowchart of the method in accordance with the invention.

FIG. 6 is a flowchart of a method for monitoring a power supply 5 connected via a signal line 15 to a superordinate controller 10 which performs queries at variable query intervals to determine whether the power supply 5 is operating faultlessly. The method comprises transmitting, by the power supply 5, a power-good signal to the superordinate controller via the signal line continuously during faultless operation, as indicated in step 610. Next, an indicating signal Sig is transmitted by the power supply to the superordinate controller via the signal line 15 as a switching sequence 4 of high-low signals if a fault occurs such that each signal change of the switching sequence 4 occurs only after a time period which is longer than an expected greatest query interval and such that each signal of the switching sequence 4 which does not correspond to the power-good signal is shorter than a specified signal duration to indicate a total failure of the power supply 5, as indicated in step 620.

Thus, while there have been shown, described and pointed out fundamental novel features of the invention as applied to a preferred embodiment thereof, it will be understood that various omissions and substitutions and changes in the form and details of the methods described and the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. A method for monitoring a power supply connected via a signal line to a superordinate controller which performs queries at variable query intervals to determine whether the power supply is operating faultlessly,
transmitting, by the power supply, a power-good signal to the superordinate controller via the signal line continuously during faultless operation; and
transmitting an indicating signal by the power supply to the superordinate controller via the signal line as a switching sequence of high-low signals if a fault occurs such that each signal change of the switching sequence occurs only after a time period which is longer than an expected greatest query interval and such that each signal of the switching sequence which does not correspond to the power-good signal is shorter than a specified signal duration to indicate a total failure of the power supply.

2. The method as claimed in claim 1, wherein a high signal is transmitted over the signal line to the superordinate controller by the power supply as the power-good signal.

3. The method as claimed in claim 2, wherein a longest cycle time to be expected of the superordinate controller comprising a stored program controller is specified as the expected greatest query interval.

4. The method as claimed in claim 1, wherein a longest cycle time to be expected of the superordinate controller comprising a stored program controller is specified as the expected greatest query interval.

5. The method as claimed in claim 1, wherein the expected greatest query interval is approximately 150 ms.

6. The method as claimed in claim 1, wherein each signal change of the switching sequence only occurs after a period of time that is twice as long as the expected greatest query interval.

7. The method as claimed in claim 1, wherein each point in time of a query is stored in the superordinate controller together with a signal state of the indicating signal; and wherein the transmitted switching sequence is derived from a sequence of these stored values and a specified fixed clock of the indicating signal.

8. The method as claimed in claim 1, wherein different types of faults are specified to the power supply;
wherein each type of fault is assigned its own switching sequence; and
wherein a corresponding switching sequence is transmitted to the superordinate controller as a fault-specific indicating signal if a fault occurs.

9. The method as claimed in claim 8, wherein the power supply includes a priority level for each fault type; and wherein, for faults occurring at the same time, the transmission of the corresponding switching sequences is arranged in order of assigned priority level.

10. The method as claimed in claim 9, wherein, when the power supply is switched on, the power supply transmits a respective identifier for each type of fault to the superordinate controller; and
wherein the priority level and a repetition specification for a multiple transmission of the corresponding switching sequence are produced from the respective identifier.

11. The method as claimed in claim 8, wherein, in accordance with a repetition specification, a first switching sequence is transmitted several times in succession to the superordinate controller; and
wherein a repeated transmission is aborted and a second switching sequence is transmitted if a fault to which the second switching sequence is assigned occurs.

12. The method as claimed in claim 8, wherein a check is made in the power supply before a successive transmission of switching sequences to the superordinate controller to determine whether another defined switching sequence is produced in a transition area of two defined switching sequences, an extended low signal or an extended high signal being transmitted between the succession of switching sequences if another defined switching sequence is produced.

13. The method as claimed in claim 8, wherein a successive transmission of switching sequences to the superordinate controller is checked in the power supply to determine whether another defined switching sequence is produced in the transition area of two defined switching sequences, a separately predefined switching sequence being transmitted to the superordinate controller to indicate an incorrect fault message if another defined switching sequence is produced.

14. The method as claimed in claim 1, wherein the power supply includes a tolerance period which starts to run if a fault occurs; and wherein that if a fault is present after the tolerance period has elapsed, a corresponding switching sequence is transmitted to the superordinate controller.

15. The method as claimed in claim 1, wherein a duration of a faulty output voltage has a time limit, a recently transmitted switching sequence being interrupted and a continuous signal which does not correspond to the power-good signal being instead transmitted after expiration of said time limit.

16. The method as claimed in claim 1, wherein the power supply is switched off for specific faults and that, after a corresponding re-activation, the power supply transmitting a corresponding switching sequence to the superordinate controller.

17. The method as claimed in claim 1, wherein each received switching sequence recognized as a fault message is stored with a time stamp in the superordinate controller.

18. The method as claimed in claim 1, wherein at least one output voltage of the power supply is continuously monitored; and wherein, if a dip in the at least one output voltage to a specified extent beyond a specified minimum time occurs, the corresponding switching sequence is transmitted to the superordinate controller to show the dip of the output voltage.

19. The method as claimed in claim 18, wherein a period of time, which is longer than a longest correction time of the power supply after a jump in a load is specified as a minimum time.

20. The method as claimed in claim 1, further comprising:
monitoring a specific temperature of the power supply is continuously; and
transmitting a corresponding switching sequence to the superordinate controller to indicate that a temperature has been exceeded if a limit temperature is reached.

21. The method as claimed in claim 1, further comprising:
monitoring an output current of the power supply continuously; and
transmitting a corresponding switching sequence is transmitted to the superordinate controller to indicate that a threshold current has been exceeded if a threshold current value is reached.

22. An arrangement comprising:
a power supply;
a superordinate controller connected to the power supply connected via a signal line, said superordinate controller performing queries at variable query intervals to determine whether the power supply is operating faultlessly;
wherein the arrangement is configure to:
transmit, by the power supply, a power-good signal to the superordinate controller via the signal line continuously during faultless operation; and
transmit an indicating signal by the power supply to the superordinate controller via the signal line as a switching sequence of high-low signals if a fault occurs such that each signal change of the switching sequence occurs only after a time period which is longer than an expected greatest query interval and such that each signal of the switching sequence which does not correspond to the power-good signal is shorter than a specified signal duration to indicate a total failure of the power supply; and
wherein an input of the superordinate controller at which the signal line is present is only configured to evaluate high/low signals.

23. The arrangement as claimed in claim 22, wherein the power supply is a clocking direct current power supply with an output for connecting the signal line.

24. The arrangement as claimed in claim 23, wherein the power supply includes separate signaling electronics which are connected to an auxiliary supply independent of the output voltage of the power supply.

25. The arrangement as claimed in claim 23, wherein the power supply includes separate module electronics which are connected to the output voltage of the power supply via a buffer circuit with an energy store, so that after the output voltage has been switched off the power supply for the signaling electronics is provided via the energy store.

26. The arrangement as claimed in claim 22, wherein the power supply includes separate signaling electronics which are connected to an auxiliary supply independent of the output voltage of the power supply.

27. The arrangement as claimed in claim 22, wherein the power supply includes separate module electronics which are connected to the output voltage of the power supply via a buffer circuit with an energy store, so that after the output voltage has been switched off the power supply for the signaling electronics is provided via the energy store.

* * * * *